(12) United States Patent
Park et al.

(10) Patent No.: US 11,478,828 B2
(45) Date of Patent: Oct. 25, 2022

(54) ADHESIVE REMOVING DEVICE AND METHOD

(71) Applicant: EO TECHNICS CO., LTD., Anyang-si (KR)

(72) Inventors: Ill Hyun Park, Anyang-si (KR); Dae Yub Cho, Suwon-si (KR); Young Jung Kim, Anyang-si (KR)

(73) Assignee: EO TECHNICS CO., LTD., Gyeonggi-Do (KR)

( * ) Notice: Subject to any disclaimer, the term of this patent is extended or adjusted under 35 U.S.C. 154(b) by 855 days.

(21) Appl. No.: 15/757,124

(22) PCT Filed: Aug. 17, 2016

(86) PCT No.: PCT/KR2016/009002
§ 371 (c)(1),
(2) Date: Mar. 2, 2018

(87) PCT Pub. No.: WO2017/039184
PCT Pub. Date: Mar. 9, 2017

(65) Prior Publication Data
US 2018/0290182 A1 Oct. 11, 2018

(30) Foreign Application Priority Data

Sep. 4, 2015 (KR) .................. 10-2015-0125604
Aug. 16, 2016 (KR) .................. 10-2016-0103758

(51) Int. Cl.
*G03F 1/82* (2012.01)
*B08B 7/00* (2006.01)
*G03F 1/64* (2012.01)

(52) U.S. Cl.
CPC .............. *B08B 7/0042* (2013.01); *G03F 1/64* (2013.01); *G03F 1/82* (2013.01); *B08B 2220/01* (2013.01)

(58) Field of Classification Search
CPC .................................................. B08B 2220/01
See application file for complete search history.

(56) References Cited

U.S. PATENT DOCUMENTS 5,958,268 A * 9/1999 Engelsberg ........... B08B 7/0042
219/121.84
6,048,588 A * 4/2000 Engelsberg ........... B08B 7/0042
134/1
(Continued)

FOREIGN PATENT DOCUMENTS

CN 102189332 A 9/2011
CN 103827627 A 5/2014
(Continued)

OTHER PUBLICATIONS

Computer Translation of KR-101495031 (published Feb. 26, 2015).*
(Continued)

*Primary Examiner* — Mikhail Kornakov
*Assistant Examiner* — Ryan L Coleman
(74) *Attorney, Agent, or Firm* — Panitch Schwarze Belisario & Nadel LLP (57) ABSTRACT

Provided is an adhesive removing device for removing an adhesive for adhering a mask and a pellicle from the mask. The adhesive removing device includes: a laser irradiating unit configured to irradiate a laser beam to an adhesive layer formed between the mask and the pellicle; a controller configured to control a wavelength, a waveform, and an energy density of the laser beam, so as to remove the adhesive layer through emission of the laser beam; and an imaging unit configured to monitor a region to which the laser beam is irradiated.

14 Claims, 5 Drawing Sheets

(56) References Cited

U.S. PATENT DOCUMENTS

| | | | |
|---|---|---|---|
| 6,541,747 B1* | 4/2003 | Kikuchi | G02B 7/36 |
| | | | 250/201.2 |
| 7,767,365 B2 | 8/2010 | Carpenter | |
| 8,562,749 B2 | 10/2013 | Le Claire | |
| 2005/0002016 A1* | 1/2005 | Tsao | H01L 21/268 |
| | | | 356/30 |
| 2005/0070035 A1* | 3/2005 | Yazaki | H01L 21/02678 |
| | | | 438/22 |
| 2010/0226004 A1* | 9/2010 | Nishimoto | G02B 5/208 |
| | | | 359/359 |
| 2010/0301023 A1* | 12/2010 | Unrath | B23K 26/032 |
| | | | 219/121.67 |
| 2012/0219654 A1* | 8/2012 | Kim | G03F 1/64 |
| | | | 425/174.4 |
| 2013/0100276 A1* | 4/2013 | Bishop | G01N 21/6456 |
| | | | 348/87 |
| 2015/0130925 A1 | 5/2015 | Park et al. | |
| 2015/0239172 A1* | 8/2015 | Dow | B29C 33/424 |
| | | | 264/2.7 |
| 2017/0059984 A1* | 3/2017 | Kim | G03F 1/82 |

FOREIGN PATENT DOCUMENTS

| | | |
|---|---|---|
| CN | 105081560 A | 11/2015 |
| KR | 10-2008-0056458 A | 6/2008 |
| KR | 10-2012-0097893 A | 9/2012 |
| KR | 10-1495031 B1 | 2/2015 |

OTHER PUBLICATIONS

International Search Report (PCT/ISA/210) dated Nov. 22, 2016, by the Korean Intellectual Property Office as the International Searching Authority for International Application No. PCT/KR2016/009002.
Written Opinion (PCT/ISA/237) dated Nov. 22, 2016, by the Korean Intellectual Property Office as the International Searching Authority for International Application No. PCT/KR2016/009002.
Office Action (The First Office Action) dated Sep. 3, 2020, by the State Intellectual Property Office of People's Republic of China in corresponding Chinese Patent Application No. 201680051025.1 and an English Translation of the Office Action. (18 pages).

\* cited by examiner

ADHESIVE REMOVING DEVICE AND METHOD

TECHNICAL FIELD

The present invention relates to a device and a method for removing an adhesive on a mask, so as to separate a pellicle from the mask.

BACKGROUND ART

In a lithography process for manufacturing a circuit pattern in a semiconductor device or a liquid-crystal display, a substrate for exposure such as a photomask or a reticle is used. However, when foreign substances such as contaminants are attached to the substrate for exposure, the accuracy of the lithography process may be reduced. In order to prevent the foreign substrates from being attached to the substrate for exposure, a dustproof cover called a pellicle is mounted on the photomask or the reticle.

In a process of manufacturing a semiconductor device, such as a large-scale integrated circuit (LSI) or an ultra-LSI, or a liquid-crystal display panel, patterning is performed by irradiating light to a photosensitive layer through a mask (also referred to as an exposure original plate or a reticle). In this case, when foreign substances are attached to the mask, the light is absorbed or bent by the foreign substances. Accordingly, a formed pattern may be deformed or edges may become uneven, thereby damaging the dimensions, quality, and appearance of the patterning. In order to solve this problem, a dustproof cover called a pellicle is mounted on the mask.

A pellicle includes a pellicle frame formed of a metal material and a pellicle film located on one surface of the pellicle frame. A mask adhesive for fixing the pellicle to a mask may be formed on the other surface of the pellicle frame. When the pellicle has reached its end of life or is damaged, the pellicle has to be replaced. To this end, the mask adhesive has to be removed.

In the related art, the mask adhesive has been removed by using a wet removing method using a sulfuric acid or organic chemical. However, in this case, not only the mask adhesive but also the mask may be damaged, and a mask adhesive removing process becomes very difficult.

DETAILED DESCRIPTION OF THE INVENTION

Technical Problem

According to embodiments, there are provided a method and a device for separating a pellicle by removing an adhesive formed between a mask and the pellicle by using a laser beam.

Technical Solution

According to an aspect of the present invention, there is provided an adhesive removing device for removing an adhesive for adhering a mask and a pellicle from the mask, the adhesive removing device including: a laser irradiating unit configured to irradiate a laser beam to an adhesive layer formed between the mask and the pellicle; a controller configured to control a wavelength, a waveform, and an energy density of the laser beam, so as to remove the adhesive layer through emission of the laser beam; and an imaging unit configured to monitor a region to which the laser beam is irradiated.

The imaging unit may include an illumination light source configured to irradiate illumination light and a camera configured to image the illumination light reflected by the region to which the laser beam is irradiated.

The adhesive removing device may further include a mirror allowing the illumination light and the laser beam to be incident thereon, and configured to transmit any one from among the illumination light and the laser beam and reflect remaining one.

A wavelength of the illumination light may be different from the wavelength of the laser beam.

The imaging unit may further include an optical filter configured to transmit light having a wavelength that is the same as a wavelength of the illumination light from among pieces of light incident on the imaging unit and block light having a wavelength that is different from the wavelength of the illumination light.

The wavelength of the laser beam may range from about 193 nm to about 290 nm.

A wavelength of the illumination light may range from about 570 nm to about 770 nm.

The adhesive removing device may further include an auxiliary imaging unit provided outside a travel path of the laser beam and configured to image the illumination light scattered on the adhesive layer and the mask.

The auxiliary imaging unit may include an optical filter configured to reflect the laser beam and transmit the illumination light and a camera configured to image the illumination light transmitted through the optical filter.

According to an aspect of the present invention, there is provided an adhesive removing method of removing an adhesive for adhering a mask and a pellicle from the mask, the adhesive removing method including: controlling a wavelength, a waveform, and an energy density of a laser beam, so as to remove an adhesive layer through emission of the laser beam; irradiating the laser beam to the adhesive layer formed between the mask and the pellicle; and obtaining an image of a region to which the laser beam is irradiated.

The adhesive removing method may further include, when it is determined that the adhesive layer is removed from the image, changing the region to which the laser beam is irradiated.

The obtaining of the image may include irradiating illumination light to the region to which the laser beam is irradiated and imaging the illumination light reflected by the region to which the laser beam is irradiated.

A wavelength of the illumination light may be different from the wavelength of the laser beam.

The obtaining of the image may include imaging the illumination light scattered on the adhesive layer and the mask, by using an imaging unit provided outside a travel path of the laser beam.

The adhesive removing method may further include transmitting any one from among the illumination light and the laser beam and reflecting remaining one, by using a mirror in a travel path of the laser beam.

The wavelength of the laser beam may range from about 193 nm to about 290 nm, and the wavelength of the illumination light may range from about 570 nm to about 770 nm.

Advantageous Effects of the Invention

According to one or more embodiments, an adhesive layer on a mask may be removed by using a laser beam. An adhesive removing process may be monitored by obtaining an image of a laser beam irradiated region. Also, an adhesive removing time may be reduced and the adhesive layer may be reliably removed by appropriately adjusting a time when the laser beam is irradiated from a monitoring result. Also, damage to the mask due to excessive irradiation of the laser beam may be prevented.

MODE OF THE INVENTION

The present invention will now be described more fully with reference to the accompanying drawings, in which exemplary embodiments of the invention are shown.

In the drawings, the same reference numerals denote the same elements, and sizes of components may be exaggerated for clarity and convenience. The invention may have different forms and should not be construed as limited to the exemplary embodiments set forth herein.

For example, it will also be understood that when an element is referred to as being "on" another element, it may be directly on the other element or may be indirectly on the other element with intervening elements therebetween.

It will be understood that, although the terms first, second, etc. may be used herein to describe various elements, these elements should not be limited by these terms. These terms are only used to distinguish one element from another.

As used herein, the singular forms "a", "an", and "the" are intended to include the plural forms as well, unless the context clearly indicates otherwise. When a part "includes" or "comprises" an element, unless there is a particular description contrary thereto, the part may further include other elements, not excluding the other elements.

In addition, terms such as ". . . unit", ". . . module", or the like refer to units that perform at least one function or operation.

Figure 1:
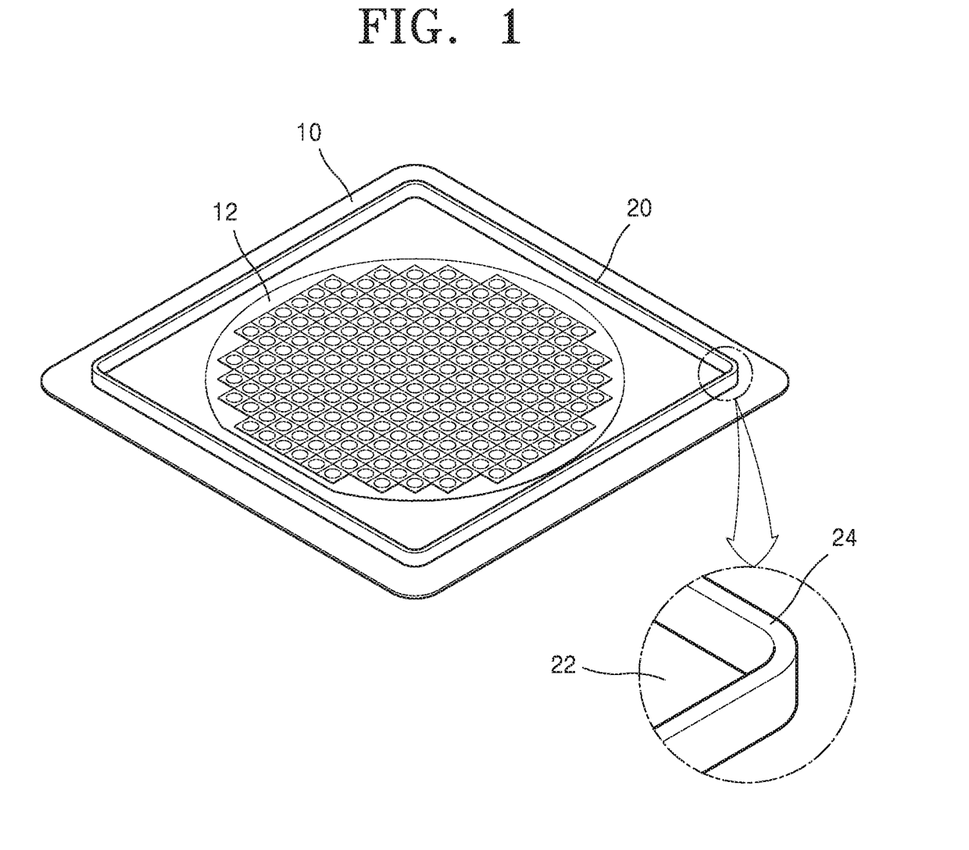
FIG. 1 is a perspective view illustrating a state where a pellicle is attached to a mask.

FIG. 1 is a perspective view illustrating a state where a pellicle 20 is attached to a mask 10. Also, FIG. 2 is a cross-sectional view illustrating the mask 10 and the pellicle 20 of FIG. 1.

Figure 2:
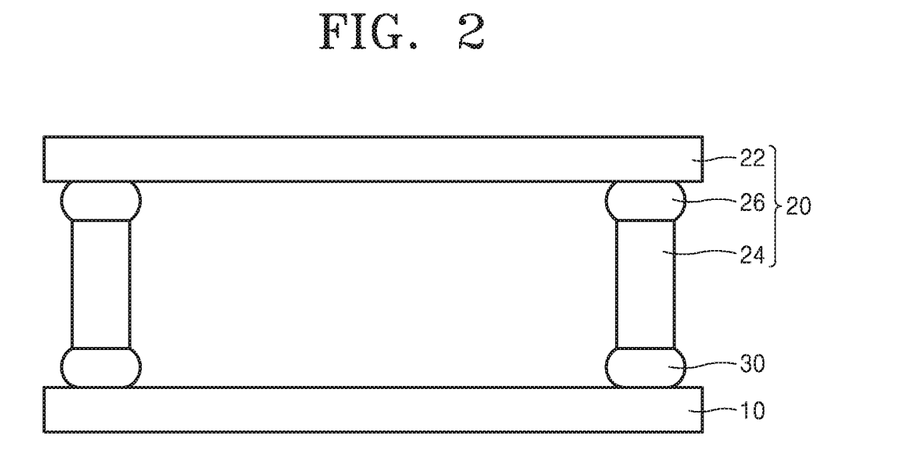
FIG. 2 is a cross-sectional view illustrating the mask and the pellicle of FIG. 1.

Referring to FIGS. 1 and 2, the pellicle 20 may be attached to the mask 10. A mask pattern 12 may be formed on the mask 10. A shape of the mask pattern 12 may vary according to a patterning shape to be formed through a lithography process on a semiconductor device, such as a large-scale integrated circuit (LSI) or an ultra LSI, or a liquid-crystal display plate. The mask 10 may include any of various materials. For example, the mask 10 may include quartz. Also, the mask 10 may include a quartz layer and a chromium (Cr) layer provided on the quartz layer. Alternatively, the mask 10 may include a quartz layer and a molybdenum silicide (MoSi) layer provided on the quartz layer. Accordingly, the mask 10 may include at least one from among quartz, Cr, and MoSi on a surface contacting an adhesive 30. The above materials are exemplary, and the present embodiment is not limited thereto.

The pellicle 20 may be attached to the mask 10. The pellicle 20 may include a pellicle frame 24 and a pellicle film 22 provided on the pellicle frame 24. A size and a shape of the pellicle frame 24 may be changed in various ways to correspond to a size and a shape of the mask 10 used in the lithography process. Alternatively, the size and the shape of the pellicle frame 24 may not necessarily correspond to the size and the shape of the mask 10. The pellicle film 22 may be attached to one surface of the pellicle frame 24. The pellicle film 22 may be attached to the pellicle frame 24 through a pellicle adhesive layer 26. However, the present embodiment is not limited thereto, and the pellicle film 22 and the pellicle frame 24 may be integrally connected without the pellicle adhesive layer 26. The pellicle film 22 formed of a transparent material may transmit light therethrough during the lithography process. The light transmitted through the pellicle film 22 may be used to pattern an object to be processed through the mask 10.

When the pellicle 20 is attached to the mask 10, a predetermined space may be formed between the pellicle film 22 and the mask 10. The predetermined space may be blocked from the outside by the pellicle film 22 and the pellicle frame 24. Accordingly, foreign substances may be prevented from being introduced into the mask 10.

The pellicle 20 may be attached to the mask 10 by using the adhesive 30. The adhesive 30 formed of an adhesive material may be used to fix the pellicle 20 to the mask 10. For example, the adhesive 30 may include a fluoropolymer-based material. Examples of the fluoropolymer-based material may include, but are not limited to, a polytetrafluoroethylene polymer, a tetrafluoroethylene (TFE)/perfluoro (alkyl vinyl ether) polymer, an ethylene/tetrafluoroethylene polymer, and chlorotrifluoroethylene (CTFE). The adhesive 30 may include a material other than the fluoropolymer-based material. For example, the adhesive 30 may include an adhesive material including a hydrogenation product of a block copolymer having a saturated cyclic hydrocarbon structure such as a styrene/isoprene/styrene triblock copolymer, and a tackifier. Also, the adhesive 30 may include a hot melt adhesive material including a styrene/ethylene/propylene/styrene triblock copolymer and an aliphatic petroleum resin.

Figure 3:
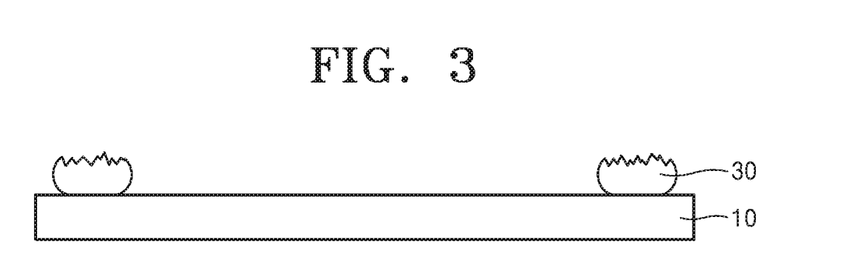
FIG. 3 is a view illustrating a state where, after the pellicle is removed from the mask, an adhesive remains on a surface of the mask.

FIG. 3 is a view illustrating a state where, after the pellicle 20 is removed from the mask 10, the adhesive 30 remains on a surface of the mask 10.

As shown in FIG. 3, when the adhesive 30 remains on the mask 10, it may be difficult to replace the pellicle 20 with a new pellicle and attach the new pellicle to the mask 10. In the related art, an organic compound or a sulfuric acid compound has been used to remove the adhesive 30 on the mask 10. That is, the adhesive 30 may be removed by using a wet cleaning process using the organic compound or the sulfuric acid compound. However, when the wet cleaning process is used, the mask pattern 12 of the mask 10 or a transmittance of a material of the mask 10 may be changed. Also, the wet cleaning process itself may be troublesome and time-consuming.

Figure 4:
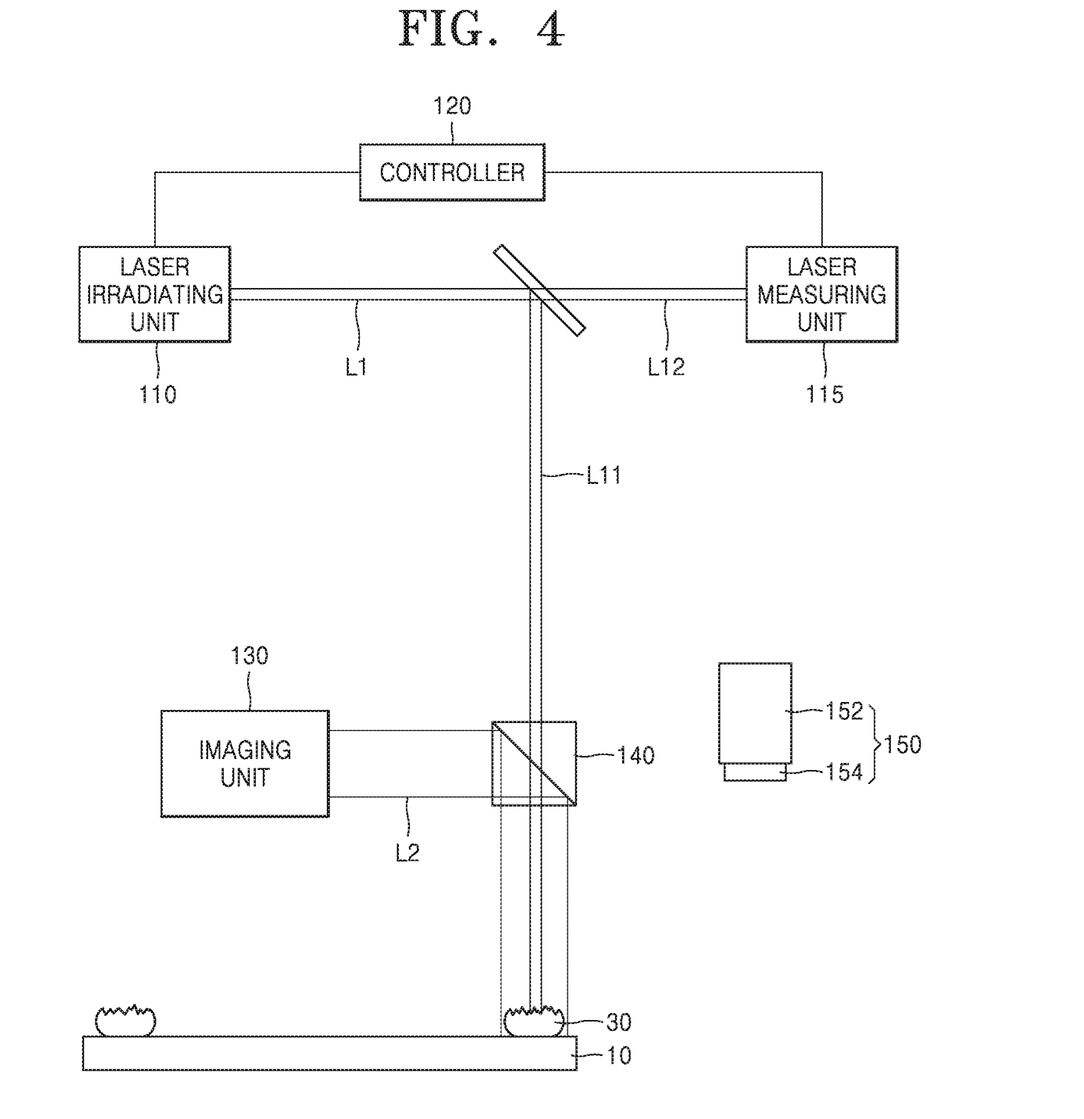
FIG. 4 is a view schematically illustrating an adhesive removing device according to an embodiment.

FIG. 4 is a view schematically illustrating an adhesive removing device according to an embodiment.

Referring to FIG. 4, the adhesive removing device may include a laser irradiating unit 110 configured to irradiate a laser beam to the adhesive layer 30 formed between the mask 10 and the pellicle 20, and a controller 120 configured to control a wavelength, a waveform, and an energy density of the laser beam so as to remove the adhesive layer 30 through emission of the laser beam. Also, the adhesive removing device may further include a laser measuring unit 115 configured to apply feedback information about parameters of the laser beam.

Most of the laser beam output from the laser irradiating unit 110 may be irradiated toward the adhesive layer 30 on the mask 10. A part of the laser beam may be incident on the laser measuring unit 115. The laser measuring unit 115 may measure a wavelength, a waveform, and an energy density of the incident laser beam. The laser measuring unit 115 may transmit parameter information of the measured laser beam to the controller 120. The controller 120 may determine control information for the parameters of the laser beam based on measurement information of the laser measuring unit 115. The controller 120 may transmit the control information to the laser irradiating unit 110.

When the controller 120 controls the waveform of the laser beam, the controller 120 may enable photons of the laser beam to have energy large enough to separate a bonding structure of the adhesive layer 30. For example, when the adhesive layer 30 includes a fluoropolymer-based material as described above, energy equal to or greater than 4.5 eV may be required to separate a bonding structure of the fluoropolymer-based material. Accordingly, the controller 120 may control the wavelength of the laser beam to be equal to or less than 266 nm. The above value is exemplary and the present embodiment is not limited thereto. The wavelength of the laser beam may vary according to a bonding structure of any of materials which the adhesive layer 30 may include. However, when the wavelength of the laser beam is too short, the mask 10 may be damaged. Accordingly, the wavelength of the laser beam may be adjusted in a range from about 193 nm to about 290 nm.

Also, the controller 120 may adjust the waveform of the laser beam to be a pulse waveform that is repeated in a predetermined cycle. In this case, the laser beam may have a pulse waveform with a predetermined pulse width and a cycle. The reason why the waveform of the laser beam is adjusted is as follows. If the waveform of the laser beam is a waveform having a constant energy intensity, instead of a pulse waveform, a temperature of the adhesive layer 30 may be continuously increased while the laser beam is irradiated. However, a temperature up to which the mask 10 may withstand without being damaged is limited. For example, a temperature of the mask 10 should be maintained at about 200° C. or lower, so as to not change characteristics of the mask 10. Accordingly, when the laser beam is irradiated to the adhesive layer 30, it is necessary to keep the temperature of the adhesive layer 30 from being increased to be higher than a temperature at which the characteristics of the mask 10 are changed. To this end, the laser beam may have a pulse waveform that is repeated in a predetermined cycle. Once the laser beam has a pulse waveform, a process of increasing the temperature of the adhesive layer 30 while energy of the laser beam is increased and reducing the temperature of the adhesive layer 30 again while the energy of the laser beam is reduced may be repeated, thereby preventing the temperature of the adhesive layer 30 from being increased monotonously.

For example, the controller 120 may adjust a pulse width of the laser beam in a range from about 10 ps to about 100 ns. Also, the controller 120 may control a cycle of a pulse wave in a range from about 10 Hz to about 100 Hz. For example, the cycle may also be increased as the pulse width is increased. However, the present embodiment is not limited thereto.

Also, the controller 120 may adjust the energy density of the laser beam in a range from about 25 mJ/cm$^2$ to about 1000 mJ/cm$^2$.

The adhesive removing deice according to an embodiment may include an imaging unit 130 configured to monitor a region to which the laser beam is irradiated. The imaging unit 130 may apply imaging information of the region to which the laser beam is irradiated. To this end, the imaging unit 130 may apply monitoring information about the removal of the adhesive layer 30. A mirror 140 may be provided in front of the imaging unit 130. The mirror 140 may transmit the laser beam therethrough. In contrast, the mirror 140 may reflect illumination light L2 emitted from the imaging unit 130 as described below.

Figure 5:
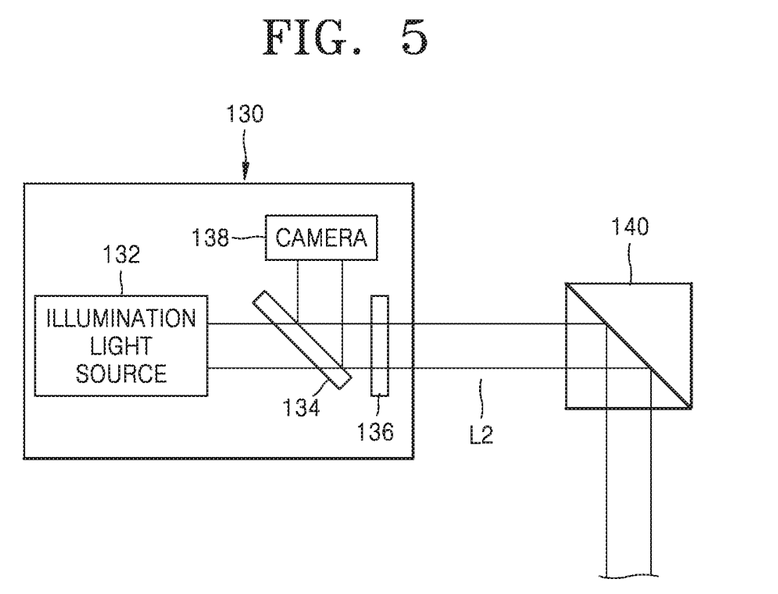
FIG. 5 is a view illustrating a configuration of an imaging unit.

FIG. 5 is a view illustrating a configuration of the imaging unit 130.

Referring to FIG. 5, the imaging unit 130 may include an illumination light source 132. The illumination light source 132 may irradiate the illumination light L2 needed to image a laser beam irradiated region. A laser beam for processing has a short wavelength and thus may be suitable for a destructive process as described above. Accordingly, when the laser beam for processing is directly imaged, a device may be damaged and the quality of an image may be degraded. Accordingly, the imaging unit 130 may obtain an image of the laser beam irradiated region by using the illumination light L2 emitted from illumination light source 132. The image includes not only real-time image information abut also still image information.

The imaging unit 130 may include a camera 138 for imaging the illumination light L2. A wavelength of the illumination light L2 may be adjusted in a visible range in order for the camera 138 to easily obtain the image. For example, the wavelength of the illumination light L2 may range from about 570 nm to about 770 nm.

The imaging unit 130 may include a beam splitter 134 for transmitting a part of light output from the illumination light source 132 and reflecting a part of illumination light reflected from the laser beam irradiated region toward the camera 138. The illumination light L2 reflected by the beam splitter 134 may be incident on the camera 138. The camera 138 may receive the illumination light L2 and may obtain the image of the laser beam irradiated region.

The imaging unit 130 may include an optical filter 136 for transmitting light having a wavelength that is the same as a wavelength of the illumination light L2 from among light incident on the imaging unit 130 and blocking light having a wavelength that is different from the wavelength of the illumination light L2. The optical filter 136 may selectively block or transmit light according to wavelengths. The optical filter 136 may block a laser beam L1 and may transmit only the illumination light L2 toward the camera 138. The optical filter 136 may prevent the laser beam from L1 being incident on the camera 138 and damaging the camera 138.

Referring back to FIG. 4, the adhesive removing device may include the mirror 140 on which the illumination light L2 and the laser beam L1 are incident. The mirror 140 may transmit any one from among the illumination light L2 and the laser beam L1 and may reflect the remaining one. For example, the mirror 140 may be a dichroic mirror that selectively reflects or transmits light according to wavelengths. Wavelengths of the laser beam L1 and the illumination light L2 may be set to be different from each other. The dichroic mirror may transmit any one from among the laser beam L1 and the illumination light L2 having different wavelengths and may reflect the remaining one.

The mirror 140 transmits the laser beam L1 and reflects the illumination light L2 in FIG. 4. However, the present embodiment is not limited thereto. For example, the mirror 140 may reflect the laser beam L1 and may transmit the illumination light L2.

Referring to FIGS. 4 and 5, the adhesive removing device may further include an auxiliary imaging unit 150 provided outside a travel path of the laser beam L1. The auxiliary imaging unit 150 may image the illumination light L2 scattered on the laser beam irradiated region. The auxiliary imaging unit 150 may include a camera 152 for imaging the illumination light L2. The auxiliary imaging unit 150 may include an optical filter 154. The optical filter 154 may selectively transmit light according to wavelengths. For example, the optical filter 1564 may block the laser beam L1 having a wavelength ranging from about 193 nm to about 290 nm and may transmit the illumination light L2 having a wavelength ranging from about 570 nm to about 770 nm. The optical filter 154 may prevent the camera 152 of the auxiliary imaging unit 150 from being damaged by the laser beam L1. Also, the optical filter 154 may improve the sharpness of an image of the illumination light L2 obtained by the camera 152.

Figure 6:
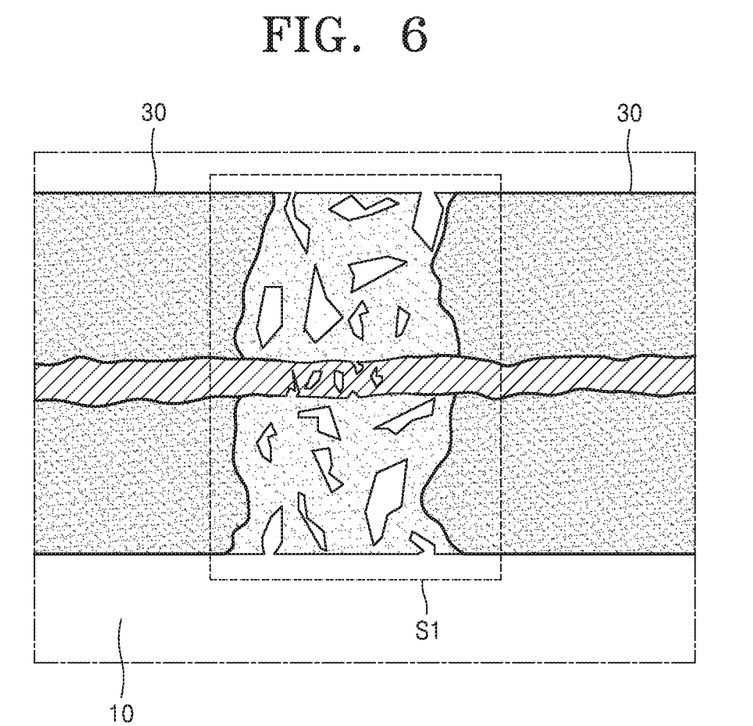
FIG. 6 is a flowchart illustrating an adhesive removing method using an adhesive removing device according to an embodiment.

FIG. 6 is a flowchart illustrating an adhesive removing method using an adhesive removing device according to an embodiment.

Referring to FIG. 6, the adhesive removing method according to an embodiment may include an operation S110 in which a wavelength, a waveform, and an energy density of the laser beam L1 are controlled so as to remove the adhesive layer 30 through emission of the laser beam L1, operation S120 in which the laser beam L1 is irradiated to the adhesive layer 30 formed between the mask 10 and the pellicle 20, and operation S130 in which an image of a region (referred to as a laser beam irradiated region) to which the laser beam L1 is irradiated is obtained.

In operation S110, the controller 120 may adjust parameters of a laser beam L1. For example, the controller 120 may adjust a wavelength of the laser beam L1 in a range from about 193 nm to about 290 nm. Also, the controller 120 may adjust a pulse width of the laser beam L1 in a range from about 10 ps to about 100 ns and a cycle of a pulse wave in a range from about 10 Hz to about 100 Hz. The controller 120 may adjust the parameters of the laser beam L1 to reduce damage to the mask 10 and cause the adhesive layer 30 to be removed by the laser beam L1.

In operation S120, the laser beam L1 output from the laser irradiating unit 110 may be irradiated to the adhesive layer 30.

In operation S130, the imaging unit 130 and the auxiliary imaging unit 150 may obtain an image of a laser beam irradiated region. So as to obtain the image, the imaging unit 130 may irradiate the illumination light L2 from the illumination light source 132 to the laser beam irradiated region. A wavelength of the illumination light L2 may range from about 570 nm to about 770 nm. The image obtained by the imaging unit 130 may be used to determine whether to change the laser beam irradiated region.

For example, the adhesive removing method may further include operation S140 in which it is checked whether the adhesive layer 30 is removed in the image obtained in operation S130 and operation S150 in which when it is checked that the adhesive layer 30 is removed, the laser beam irradiated region is changed.

In operation S140, it may be determined whether the adhesive layer 30 is removed from the image. It may be checked whether an image obtained after removing the adhesive layer 30 is shown in the image. The checking may be performed by a person by directly checking the image and determining whether to change the laser beam irradiated region. Alternatively, the determining may be performed by a computing device embedded in the imaging unit 130. The computing device may analyze the image by using a designated algorithm. For example, the computing device may store an image of a surface of the mask 10 from which the adhesive is removed as a reference image. The computing device may evaluate a similarity between both images by comparing the image with the reference image. The computing device may determine whether to further irradiate the laser beam L1 from evaluation information about the similarity. For example, when the evaluation information about the similarity is converted into a score, the computing device may determine that the adhesive layer 30 is removed when the score is equal to or greater than a reference value.

Figure 7:
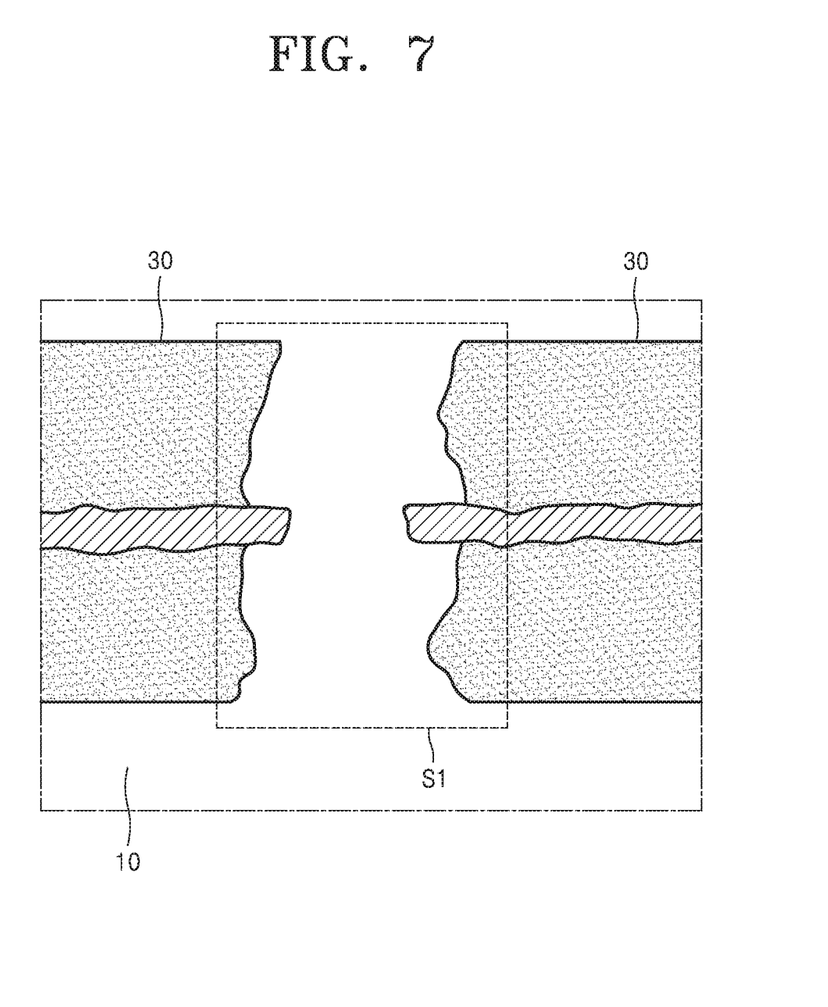
FIG. 7 is a view illustrating an example of an image obtained by the imaging unit.

FIG. 7 is a view illustrating an example of an image obtained by the imaging unit 130.

Referring to FIG. 7, it may be found that the adhesive layer 30 remains without being completely removed in a laser beam irradiated region S1. As shown in FIG. 7, when the adhesive layer 30 remains in the laser beam irradiated region S1 in the image, the adhesive removing method may return to operation S120 and the laser beam L1 may be further irradiated.

Figure 8:
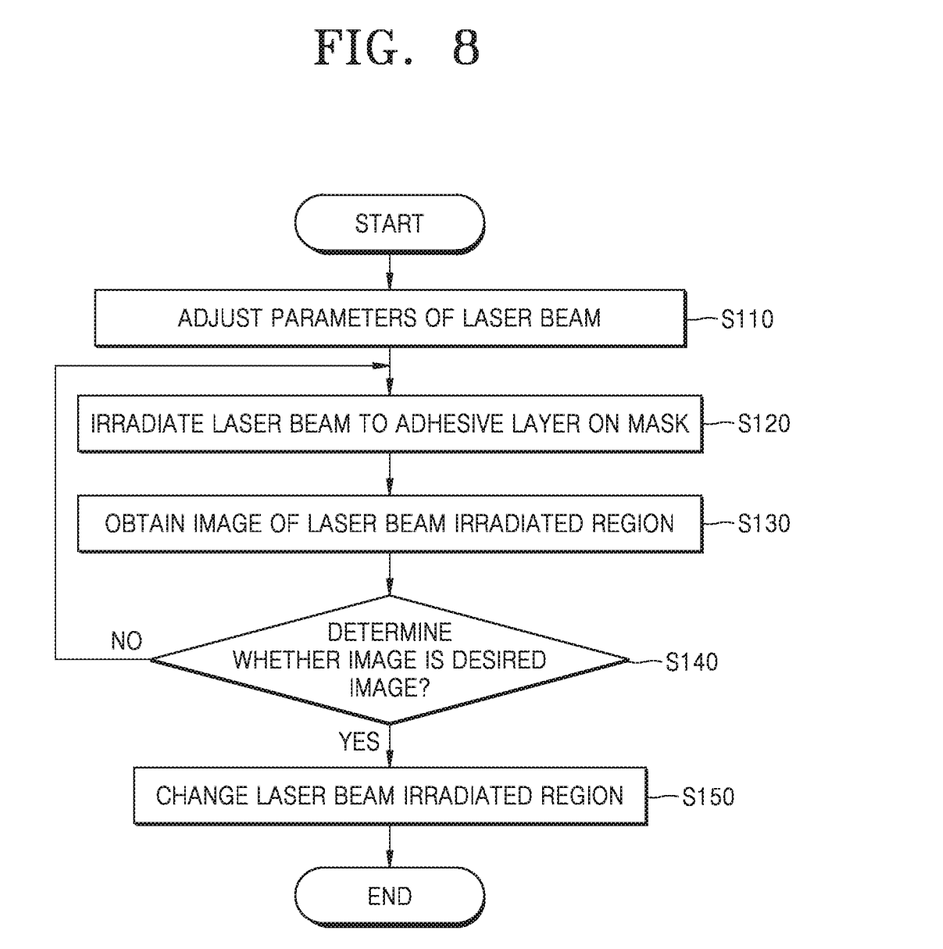
FIG. 8 is a view illustrating another example of an image obtained by the imaging unit.

FIG. 8 is a view illustrating another example of an image obtained by the imaging unit 130.

Referring to FIG. 8, it may be found that the adhesive layer 30 is removed and a surface of the mask 10 is exposed in the laser beam irradiated region S1. As shown in FIG. 8, when the adhesive layer 30 does not remain in the laser beam irradiated region S1 in the image, the adhesive removing method proceeds to operation S150 in which the laser beam irradiated region S1 is changed. When the laser beam irradiated region S1 is changed in operation S150, a direction in which the laser irradiating unit 110 irradiates the laser beam L1 may be changed. Alternatively, a direction in which the laser beam L1 is irradiated may be changed by adjusting a direction of a scanner without changing the direction in which the laser irradiating unit 110 irradiates the laser beam L1. Alternatively, the mask 10 may be moved by moving an object stage (not shown) without changing a position where the laser beam L1 is irradiated. The laser irradiated region S1 on the mask 10 and the adhesive layer 30 may be changed by moving the mask 10 relative to the position where the laser beam L1 is irradiated.

The adhesive removing device and method according to the one or more embodiments have been described with reference to FIGS. 1 through 8. According to the embodiments, the adhesive layer 30 on the mask 10 may be removed by using the laser beam L1. An adhesive removing process may be monitored by obtaining an image of a laser beam irradiated region. Also, an adhesive removing time may be reduced and the adhesive layer 30 may be reliably removed by appropriately adjusting a time when the laser beam L1 is irradiated from a monitoring result. Also, damage to the mask 10 due to excessive emission of the laser beam L1 may be prevented.

While one or more embodiments have been described with reference to the figures, it will be understood by one of ordinary skill in the art that various changes in form and details may be made therein without departing from the spirit and scope as defined by the following claims.

The invention claimed is:

1. An adhesive removing device for removing an adhesive for adhering a mask and a pellicle from the mask, the adhesive removing device comprising:
    a laser irradiating unit configured to irradiate a laser beam to an adhesive layer formed between the mask and the pellicle;
    a controller configured to control a wavelength, a waveform, and an energy density of the laser beam, so as to remove the adhesive layer through emission of the laser beam, wherein the controller varies at least the wavelength according to a bonding structure of a material that forms the adhesive; and
    an imaging unit configured to monitor a region to which the laser beam is irradiated, wherein said imaging unit includes
        an illumination light source configured to irradiate illumination light needed to image the laser beam, and
        a beam splitter configured to transmit a portion of the light output from the illumination light source; and
    wherein the adhesive removing device comprises a mirror upon which the illumination light and the laser beam are incident during removal of the adhesive layer, wherein the mirror is configured to transmit any one from among the illumination light and the laser beam and reflect a remaining one of the illumination light and the laser beam.

2. The adhesive removing device of claim 1, wherein the imaging unit further includes a camera configured to image illumination light reflected by the region to which the laser beam is irradiated, and wherein the beam splitter included in the imaging unit is further configured to reflect a portion of the illumination light reflected from the laser beam irradiated region toward the camera.

3. The adhesive removing device of claim 2, wherein a wavelength of the illumination light is different from the wavelength of the laser beam.

4. The adhesive removing device of claim 2, wherein the imaging unit further comprises an optical filter configured to transmit light having a wavelength that is the same as a wavelength of the illumination light from light incident on the imaging unit and to block light having a wavelength that is different from the wavelength of the illumination light.

5. The adhesive removing device of claim 1, wherein the wavelength of the laser beam ranges from about 193 nm to about 290 nm.

6. The adhesive removing device of claim 2, wherein a wavelength of the illumination light ranges from about 570 nm to about 770 nm.

7. The adhesive removing device of claim 2, further comprising an auxiliary imaging unit provided outside a travel path of the laser beam and configured to image illumination light scattered on the adhesive layer and the mask.

8. The adhesive removing device of claim 7, wherein the auxiliary imaging unit comprises an optical filter configured to reflect the laser beam and transmit the illumination light and a camera configured to image the illumination light transmitted through the optical filter.

9. An adhesive removing method of removing an adhesive for adhering a mask and a pellicle from the mask, the adhesive removing method comprising:
    controlling, by a controller of an adhesive removing device, a wavelength, a waveform, and an energy density of a laser beam, so as to remove an adhesive layer through emission of the laser beam, wherein at least the wavelength is varied according to a bonding structure of an adhesive material that forms the adhesive;
    irradiating, by a laser irradiating unit of the adhesive removing device, the laser beam to the adhesive layer formed between then mask and the pellicle;
    obtaining, by an imaging unit of the adhering removing device, an image of a region to which the laser beam is irradiated,
    irradiating, by an illumination light source of the imaging unit of the adhesive removing device, illumination light needed to image the laser beam, and
    transmitting, by a beam splitter of the imaging unit of the adhesive removing device, a portion of the light output from the illumination light source;
    wherein the illumination light and the laser are incident upon a mirror during removal of the adhesive layer, and wherein the mirror is configured to transmit any one from among the illumination light and the laser beam and reflect a remaining one of the illumination light and the laser beam.

10. The adhesive removing method of claim 9, further comprising, when it is determined that the adhesive layer is removed from the image, changing the region to which the laser beam is irradiated.

11. The adhesive removing method of claim 9, further comprising imaging illumination light reflected by the region to which the laser beam is irradiated, and reflecting, by the beam splitter of the imaging unit, a portion of the illumination light reflected from the laser beam irradiated region toward the camera.

12. The adhesive removing method of claim 11, wherein a wavelength of the illumination light is different from the wavelength of the laser beam.

13. The adhesive removing method of claim 11, wherein the method comprises imaging illumination light scattered on the adhesive layer and the mask, by using an imaging unit provided outside a travel path of the laser beam.

14. The adhesive removing method of claim 12, wherein the wavelength of the laser beam ranges from about 193 nm to about 290 nm, and the wavelength of the illumination light ranges from about 570 nm to about 770 nm.

* * * * *